United States Patent
Srinivasan et al.

(10) Patent No.: US 7,076,758 B1
(45) Date of Patent: Jul. 11, 2006

(54) USING ROUTER FEEDBACK FOR PLACEMENT IMPROVEMENTS FOR LOGIC DESIGN

(75) Inventors: Sankaranarayanan Srinivasan, Longmont, CO (US); Anirban Rahut, San Jose, CA (US); Krishnan Anandh, San Jose, CA (US); Sudip K. Nag, San Jose, CA (US)

(73) Assignee: XILINX, Inc., San Jose, CA (US)

( * ) Notice: Subject to any disclaimer, the term of this patent is extended or adjusted under 35 U.S.C. 154(b) by 354 days.

(21) Appl. No.: 10/637,242

(22) Filed: Aug. 7, 2003

(51) Int. Cl.
*G06F 17/50* (2006.01)

(52) U.S. Cl. .............................. 716/11; 716/6; 716/10; 716/13

(58) Field of Classification Search ............... None
See application file for complete search history.

(56) References Cited

U.S. PATENT DOCUMENTS

| | | | | |
|---|---|---|---|---|
| 5,587,923 A * | 12/1996 | Wang | ......................... | 716/13 |
| 5,629,860 A * | 5/1997 | Jones et al. | ..................... | 716/6 |
| 5,798,936 A * | 8/1998 | Cheng | ......................... | 716/13 |
| 6,327,693 B1 * | 12/2001 | Cheng et al. | ................... | 716/2 |
| 6,507,938 B1 * | 1/2003 | Roy-Neogi et al. | ........... | 716/10 |
| 6,557,145 B1 * | 4/2003 | Boyle et al. | .................... | 716/2 |
| 6,584,607 B1 * | 6/2003 | Irie | ............................. | 716/10 |
| 6,601,226 B1 * | 7/2003 | Hill et al. | ..................... | 716/10 |
| 6,766,504 B1 * | 7/2004 | Rahut et al. | .................. | 716/13 |
| 6,782,520 B1 * | 8/2004 | Igusa et al. | .................... | 716/9 |
| 6,813,754 B1 * | 11/2004 | Wu et al. | ...................... | 716/10 |
| 6,871,336 B1 * | 3/2005 | Anderson | ...................... | 716/9 |

OTHER PUBLICATIONS

U.S. Appl. No. 10/624,615, filed Jul. 21, 2003, Anderson et al.

* cited by examiner

*Primary Examiner*—Leigh M. Garbowski
(74) *Attorney, Agent, or Firm*—Kevin Cuenot

(57) ABSTRACT

Within a computer automated tool, a method of physical circuit design can include assigning initial locations to components in the circuit design and determining an initial routing of connections between components in the circuit design using an overlap mode. The method also can include determining timing critical connections and selectively relocating components with at least one timing critical connection prior to performing a detailed routing of the circuit design.

22 Claims, 2 Drawing Sheets

USING ROUTER FEEDBACK FOR PLACEMENT IMPROVEMENTS FOR LOGIC DESIGN

BACKGROUND

1. Field of the Invention

This invention relates to the field of physical circuit design and, more particularly to the placement of a design.

2. Description of the Related Art

Designs for both application specific integrated circuits (ASIC's) and field programmable gate arrays (FPGA's) have become increasingly complex and heterogeneous. Modern ASIC and FPGA designs can include a variety of different components or resources including, but not limited to, block random access memory (RAM), multipliers, processors, and the like. Further, modern circuit designs incorporate different wiring materials for routing signals of differing lengths in any of a variety of directions. Typically, each material has unique properties which cause signal propagation delays to vary with the type of wiring material used. This increasing complexity makes placement of circuit design components more cumbersome.

As a result, timing driven placement has become increasingly important in very large scale integration (VLSI) design. Placement refers to the assignment of a component to a particular physical location in an ASIC or FPGA design. The objective of a placer is to assign locations to components such that signals can be routed using minimal resources and/or with minimal delay as governed by circuit design constraints. Typically, the placement function is based upon wire length and timing as determined using estimates of the time required for a signal to propagate the length of a connection. Such delay estimates, however, can be less than accurate as the estimates are not based upon actual routing data for the circuit design.

One reason for the potential inaccuracy of delay estimates is the variety of different wiring resources available within a circuit design. As noted, a variety of different wiring materials can be used, each having a different set of physical properties and corresponding signal propagation delay characteristics. Accordingly, the signal propagation delay between two pins may not be directly proportional to the distance between the pins. For instance, a signal may require more time to travel a connection spanning a distance of 4 units than a connection spanning a distance of 6 units. Such is the case, for example, where more than one type of wiring material is needed to route a particular signal or connection.

In consequence, many placement errors are not found until the placement phase has completed and the detailed routing phase of circuit design begins. Still, conventional placing tools continue to rely upon timing estimates and have no knowledge of how signal routing is to be accomplished for the circuit design.

What is needed is a technique where routing functions can be incorporated within the placement phase such that the resulting design placement quality is improved.

SUMMARY OF THE INVENTION

The present invention provides a solution for determining placement for a circuit design. More particularly, the present invention provides a lightweight router which generates routing information for use in designing both application integrated circuit (ASIC) and field programmable gate array (FPGA) designs. The routing information generated by the lightweight router can be fed back to the placer. Using the information provided by the router, the placer can improve the placement quality of the circuit design with respect to timing delays.

One embodiment of the present invention can include a method of physical design within a computer automated tool. The method can include: (a) assigning initial locations to components in the circuit design; (b) determining an initial routing of connections between components in the circuit design using an overlap mode; (c) determining timing critical connections; and (d) selectively relocating components with at least one timing critical connection prior to performing a detailed routing of the circuit design. Notably, steps (b) through (d) can be repeated until a stopping criterion is met.

According to another embodiment of the present invention, timing critical connections can be determined and routed using a delay mode between steps (b) and (c). In that case, step (d) can relocate only components with at least one timing critical connection routed in the delay mode.

In another embodiment, the connections can be sorted into classes according to whether the connection was routed in the delay mode, a resource mode, or a combination of the delay and the resource modes. As such, steps (c) and (d) can be limited to operating on one or more of the determined classes.

In another embodiment, weights can be determined for components of the circuit design. The weights can be determined according to timing delays of connections of each circuit component. In that case, step (d) can selectively relocate components according to determined weights of components.

Another embodiment of the present invention can include a system for physically designing a circuit. The system can include a global placer configured to determine initial locations of components in a circuit design. The system also can include a router configured to determine initial connections for placed components using an overlap mode. The router further can determine timing critical connections of the circuit design. A routing aware placer can be included. The routing aware placer can be configured to relocate the components of the circuit design having at least one timing critical connection as determined by the router. Notably, the router also can reroute connections determined to be timing critical using a delay mode and reroute connections of components relocated by the routing aware placer.

BRIEF DESCRIPTION OF THE DRAWINGS

There are shown in the drawings, embodiments which are presently preferred, it being understood, however, that the invention is not limited to the precise arrangements and instrumentalities shown.

DETAILED DESCRIPTION OF THE INVENTION

The present invention provides a solution for optimizing placement for a circuit design. More particularly, the present invention provides a lightweight router which generates routing information such as routing delays and routing patterns. The routing information generated by the lightweight router can be used as feedback to a placer. Using the information provided by the router, the placer can improve the placement quality of the circuit design.

Figure 1:
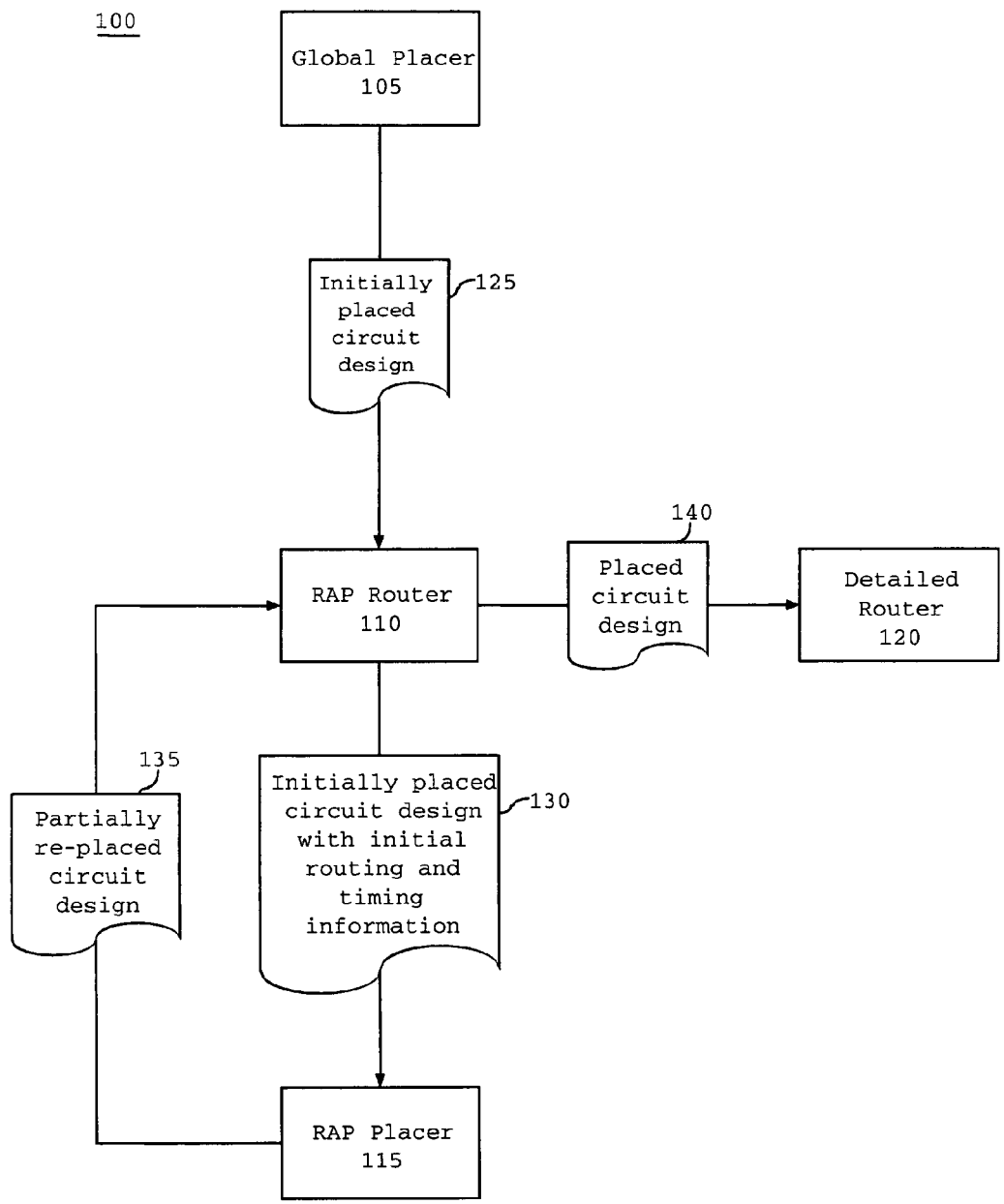
FIG. 1 is a schematic diagram illustrating one embodiment of a system for placing and routing a circuit design.

FIG. 1 is a schematic diagram illustrating one embodiment of a system 100 for placing and routing a circuit design. In accordance with the inventive arrangements disclosed herein, system 100 can be used to place and design application specific integrated circuit (ASIC) as well as field programmable gate array (FPGA) circuit designs. As shown, the system 100 can include a global placer 105, a routing aware placer (RAP) router 110, a RAP placer 115, and a detailed, or conventional, router 120.

For a given circuit design, the global placer 105 performs an initial assignment of components to physical locations on the chip or circuit. The RAP router 110 performs an initial routing of signals in the circuit design. The RAP router 110 also can determine timing information regarding routed delays for connections, delay routed pins, as well as new timing requirements for the connections, for example after a component is relocated as described herein. The RAP router 110 provides the determined timing information to the RAP placer 115 as feedback.

According to one embodiment of the present invention, the RAP router 110 can be implemented as a modified version of a standard wave-front expansion router. The RAP router 110 can receive as input a vector of signals to be routed and the mode in which the signals are to be routed. Signals of a circuit design typically can be routed in one of two modes, a resource mode and a delay mode. In resource mode, the RAP router 110 seeks to route signals between circuit nodes, that is route connections, using a minimum number of wires or resources. Resource mode does not minimize the propagation delay for a connection. In contrast, in delay mode, signals are routed such that the signal propagation delay for each connection is minimized. Once a connection is routed in delay mode, that connection cannot be optimized any further in terms of propagation delay.

The RAP router 110 also can receive as input one or more control parameters to control the number of signals that are to be routed in delay mode. The RAP router 110 further can include a data store, for example a database or other suitable data structure, having a listing of circuit design routing resources that can be shared. Using this data store, the RAP router 110 can route signals in an overlap mode that allows overlap conditions to occur. An overlap condition refers to the case where more than one signal shares a single wire, an illegal condition. While overlap conditions produce an infeasible routing, still, valuable timing information can be determined from such a state.

The RAP placer 115 receives timing information as feedback from the RAP router 110. According to one embodiment of the present invention, the RAP placer 115 can call the RAP router 110 to obtain timing information that can be used within the placer domain. That is, the RAP placer 115 can utilize the timing information provided by the RAP router 110 to determine possible components of the circuit design to be relocated. The RAP placer 115 can selectively relocate one or more components as dictated by the timing information.

In illustration, once an initial placement of a circuit design is performed, connections that are routed in delay mode that fail to meet timing constraints of the circuit design can be identified. Recalling that once a signal is routed in delay mode, no further optimization of the connection can be performed in terms of signal delay, only the placement of the component associated with the failing connection can be changed.

The detailed router 120 can perform a final routing of signals in the circuit design. More particularly, once the circuit design placement is set or finalized, the detailed router 120 can operate on the circuit design to route signals in accordance with predetermined or programmed design constraints and timing information determined during the placement phase. Accordingly, the detailed router 120 can route signals in either delay mode or resource mode, verify that the routing complies with established design constraints, and ensure that the resulting routing is feasible. In other words, the detailed routing does not utilize an overlap mode.

According to another embodiment of the present invention, a timing engine (not shown) can be used to determine timing delays and slack values for the circuit design. For example, the RAP router 110 can call or be communicatively linked with such a timing engine to obtain timing information once an initial routing or any rerouting has been performed.

The global placer 105, the RAP router 110, the RAP placer 115, and the detailed router 120 can be implemented as application programs executing within a suitable computer and/or information processing system. It should be appreciated that while each is depicted in FIG. 1 as a separate entity, one or more of the application programs can be combined into a larger, more complex application. For example, the RAP router 110 and the RAP placer 115 can be combined if so desired. In any case, those skilled in the art will recognize that the examples presented herein are not intended as a limitation of the present invention.

In operation, a circuit design can be loaded into the global placer 105. The global placer 105 can perform an initial placement for the circuit design. The initially placed circuit design 125 then can be provided to the RAP router 110. The RAP router 110 performs an initial routing for the circuit design by routing particular signals in overlap mode. Also, based upon design constraints provided by the entity invoking the RAP router 110, for example, the RAP placer 115, the RAP router can selectively route signals using delay mode or resource mode.

The RAP router 110 then can perform a timing analysis upon the initial routing of the circuit design. If the timing analysis reveals that one or more connections are not meeting the timing constraints, the RAP router can perform another routing for such connections. If not already routed in delay mode, these connections can be routed using the delay mode.

The initially routed circuit design 130 along with any determined timing information can be provided to the RAP placer 115. The RAP placer 115 can perform an analysis to identify connections that are not meeting established timing constraints. Any such connections, particularly those already routed in delay mode, can be identified in addition to the component or components to which the connection is associated. Accordingly, the RAP placer 115 can relocate any components in an effort to reduce the delay associated with the connection to meet the timing constraints. More specifically, either one or more of a set (or sets) of components sharing a connection or connections that are failing to meet timing constraints can be moved closer to one another.

The circuit design 135, having one or more components assigned to new positions, can be provided to the RAP router 110. The RAP router 110 can be configured to reroute only those connections that are affected by the relocation of components by the RAP placer 115. The RAP router 110 then can perform a new timing analysis upon the circuit design, as well as reroute connections in delay mode or resource mode as necessary to meet established timing constraints.

While the system 100 can operate on the placement of the circuit design in an iterative fashion, once a determination is made that the circuit design placement has been optimized to a sufficient degree, the placed circuit design 140 can be provided to the detailed router 120. The detailed router 120 then can perform a detailed or final routing of the placed circuit design 140.

Figure 2:
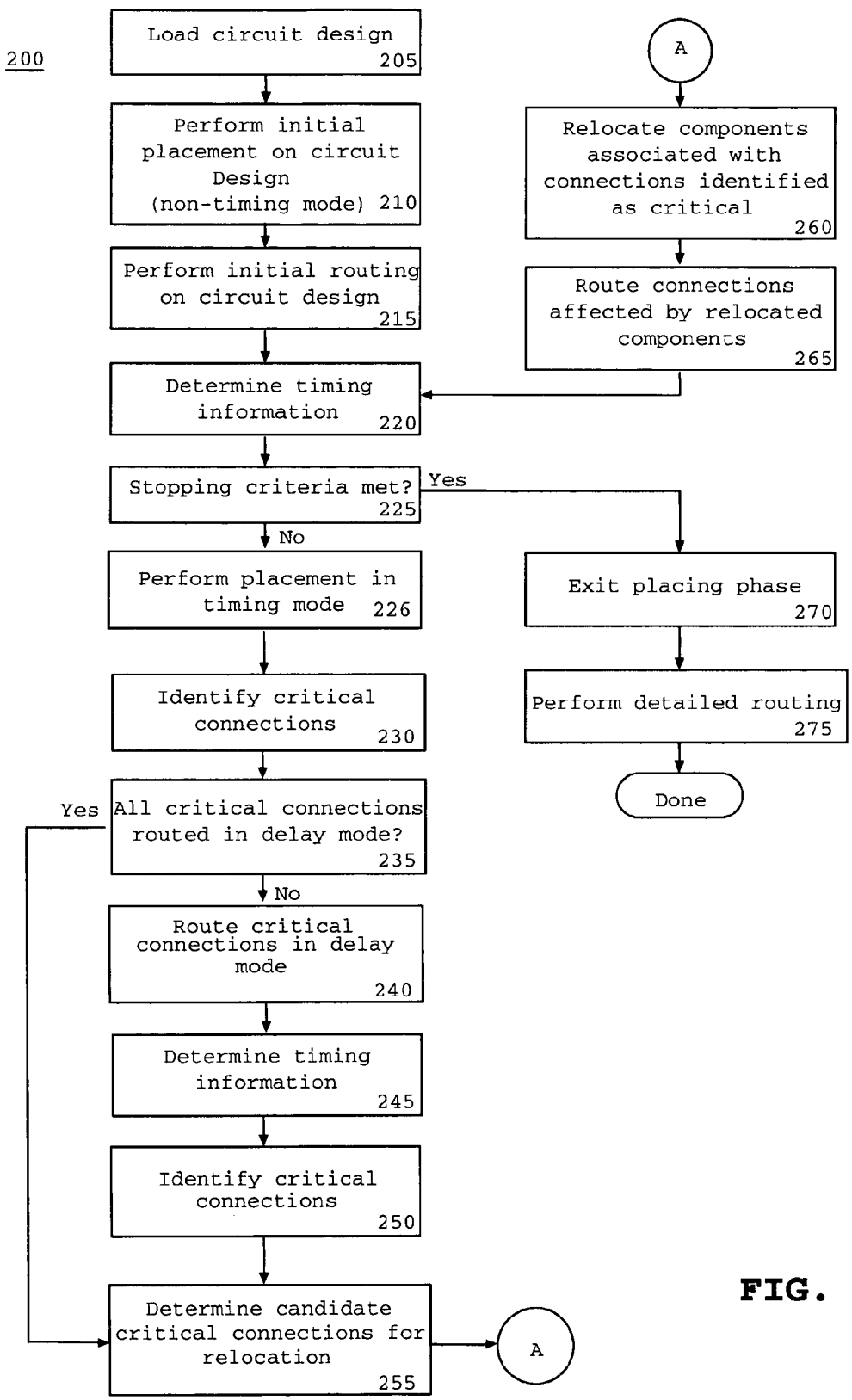
FIG. 2 is a flow chart illustrating a method of placing a circuit in accordance with the inventive arrangements disclosed herein.

FIG. 2 is a flow chart illustrating a method 200 of placing a circuit in accordance with the inventive arrangements disclosed herein. The method can begin in step 205 where a circuit design is loaded into the global placer. In step 210, the global placer performs an initial placement of the circuit components (in a non-timing mode). In step 215, the RAP router performs a quick routing of the circuit design using overlaps to minimize resource usage.

The RAP router, in step 220, then performs a timing analysis of the circuit design. The timing analysis can include calculating a path slack for each connection. The path slack refers to the difference between the target delay (a design constraint) and the path delay as determined from the initial routing with overlaps allowed. The path slack for each connection can be determined by subtracting the path delay of a path from the target delay. A path slack which is less than 0 indicates a path having a path delay greater than the target delay. Such connections can be referred to as critical connections in that the time required for a signal to propagate through the connection is longer than allowed by a design constraint.

In step 225, the RAP router, or a timing engine, can determine whether any of a variety of different stopping criteria have been met. The occurrence of any of the stopping criteria causes the method to proceed to step 270 to exit the placing phase and perform a detailed routing of the circuit design in step 275. The stopping criteria can be evaluated and updated through each iteration of the method 200.

One stopping criterion can include setting a predetermined maximum number of iterations through which method 200 can repeat. When the maximum number of iterations has completed, the method can proceed to step 270 so that detailed routing of the circuit design can be performed.

Another stopping criterion can include the calculation of a metric referred to as a RAP score and the comparison of that metric to a threshold. The RAP score quantifies the quality the present state of the placement of the circuit design. The RAP score can be calculated in terms of resource usage, such as wire length, and timing, in reference to routed delays with overlap. During the initial placement stage performed by the global placer, wire length can be weighted to be the most significant contributor to the RAP score. In later placement stages, for example, those performed by the RAP placer, timing can be weighted to be the most significant contributor to the RAP score.

In any case, during each iteration through method 200, the RAP score can be calculated to determine a metric for the quality of the present state of the placement of the circuit design. The RAP score can be compared to a predetermined threshold. Once the RAP score exceeds the threshold, the method can proceed from step 225 to step 270 to exit the placing phase and proceed with detailed routing in step 275.

Another stopping criteria can include an evaluation as to the amount the RAP score changes from iteration to iteration of the method 200. The RAP score of a current iteration can be compared to a RAP score for the previous iteration. If the RAP score does not improve by a predetermined threshold, indicating a desired amount of improvement in terms of placement quality, the method can proceed from step 225 to step 270 as well. For example, if the RAP score does not improve by a predetermined percentage, the method 200 can exit the placing phase in step 270 and continue to detailed routing in step 275.

At step 226 timing driven placement on the circuit design is performed using the timing information from step 220. After the timing driven placement is done, the stopping criteria may again be checked (not shown in FIG. 2). For example, the RAP score may be calculated and if it exceeds a predetermined threshold, the method can proceed from step 226 to step 270 to exit the placing phase and proceed with detailed routing in step 275. If the RAP score is less than or equal to the predetermined threshold, then step 230 is performed next.

In step 230, the RAP router can identify those connections determined to be critical, i.e. those connections having a delay greater than the target delay. The critical connections then can be rerouted in delay mode. In step 235, the RAP router can determine whether all of the critical connections are routed in delay mode. If so, the method can proceed to step 255. If not, the method can proceed to step 240.

In step 240, in the case where at least one critical connection has not been routed in delay mode, the RAP router routes one or more of the critical connections in delay mode as determined by the control values. As discussed, in one embodiment of the present invention, the control values can be provided by a client of the RAP router, for example the RAP placer.

Despite a significant portion of the routing being performed with overlaps, and the routing being an infeasible solution, the routing does provide useful information. In particular, a connection that is routed in delay mode that fails to meet its timing requirements can only be corrected by changing the placement of the component or components that are associated with the failing connection.

Notably, routing with overlaps also gives an insight to congestion. Conventional routers can utilize a negotiated congestion mechanism where non-critical connections negotiate with critical connections for resource usage. The non-critical connections can be detoured. Hence, the amount of congestion can directly impact the performance of the circuit design. Congestion can be modeled as a supply and demand problem for circuit routing resources. Measuring congestion earlier in the design cycle can lead to significant savings for both time and resources. As congestion analysis should be accurate during the physical implementation of a circuit design, an important aspect of using the RAP router for determining congestion is the fact that congestion is not resource congestion, but rather actual timing congestion.

In step 245, timing information for the rerouted connections can be determined. In step 250, the critical connections again can be identified. The critical pins, which can be marked or identified as delay-tag pins, can be fed to the RAP placer to begin optimizing placement of the circuit design with respect to timing.

Notably, the connections identified as delay-tagged pins are actual critical connections. That is, if no further placement changes were applied to the circuit design prior to the detailed routing phase, the critical connections would fail the timing requirements for the circuit design. As the critical connections and the slack determinations for the connections are based upon real routed delays, an accurate view of the relative ordering and relative criticality of the connections can be obtained. This information, provided to the RAP placer as feedback, aids the placer in choosing which connections to optimize.

In step 255, the RAP placer can determine candidate critical connections for relocation. That is, the RAP placer can determine the components having the most critical connections and determine which components are to be relocated. In one embodiment of the present invention, a graph is used to represent the circuit design such that logic components are represented by nodes on the graph. The edges of each node represent the connections between respective nodes.

The RAP placer can compute an edge weight for each node. The edge weights are based on the timing criticality of each node. In other words, an edge weight provides a measure as to the number of critical connections associated with each node as well as a degree of criticality for the node. The criticality for each connection of a node can be quantified in terms of the slack, or the degree to which the connection is missing its target delay time. Generally, the edge weight of a node can include a summing of slacks for each connection associated with the node. The edge weight can be proportional to the amount by which the respective connections of a node exceed the target delay for each connection.

The timing calculations tend to be accurate as timing analysis is performed by the RAP router, based upon actual routings, rather than estimates. The edge weights can be modified or updated after every iteration of the method 200, and particularly the operation of the RAP placer.

At any given time, the edge weights represent the present criticality of a connection as well as previous criticality states of the connection. According to one embodiment, a history of edge weights can be maintained for each node. Further, edge weights for nodes can be summed from iteration to iteration such that a new edge weight for a node is added to a running total of prior edge weights for the node.

While the critical connections can be evaluated on an individual basis, according to one embodiment of the present invention, a binning technique can be used to order the critical connections for purposes of evaluation by the RAP placer. Critical pins can be sorted into one or more classes.

In one embodiment, the connections can be sorted into three types of bins or classes. The critical connections can be sorted such that one class of connections can include only delay mode routed critical connections, another class can include only resource mode routed critical connections, and yet another class can include critical connections routed using both resource and delay modes. The binning or sorting technique enables the RAP placer to make an informed decision as to which components are the most desirable candidates to relocate. Thus, the RAP placer can be programmed to relocate components having all or a predetermined portion of connections sorted into one or more of the determined classes.

In step 260, any components having connections identified as critical in step 255 can be relocated. More particularly, the RAP placer can identify components sharing critical connections and relocate the components closer to one another such that the delay of the interlinking connection is lessened. Further details on using an incremental placer to relocate or replace components may be found in U.S. patent application Ser. No. 10/273,448, titled "Incremental Placement Of Design Objects In Integrated Circuit Design" by Jason H. Anderson, filed Oct. 17, 2002 and U.S. patent application Ser. No. 10/213,775, titled Relocation of Components for Post-Placement Optimizer by Kamal Chaudhary, et al., filed Aug. 6, 2002 which are herein incorporated by reference.

Accordingly, in step 265 any connections that were affected by the relocation of components in step 260 can be rerouted. The RAP router can route such connections in an overlap mode After completion of step 265, the method can proceed to step 220 to determine timing information for the circuit design and repeat as necessary.

Exemplary embodiments of the present invention provides a method, system, and apparatus, in which placement and routing mechanisms are configured to work in tandem with respect to a similar set of critical connections. Delay information determined for connections is utilized within the placement phase to achieve an improved placement for the circuit design. In addition, the feedback information determined by the RAP router provided to the RAP placer regarding connection delays is reasonably accurate and specifies which pins are considered important to the RAP router in terms of timing criticality. Accordingly, the present invention provides a dynamic and accurate strategy for identifying critical placement conditions earlier in the design cycle, i.e. in the placement phase, and correcting those conditions.

The present invention can be realized in hardware, software, or a combination of hardware and software. The present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The present invention also can be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. Within a computer automated tool, a method of circuit design comprising:
    (a) assigning initial locations to components in the circuit design;
    (b) determining an initial routing of connections between components in the circuit design, using an overlap mode;
    (c) determining timing critical connections; and
    (d) selectively relocating one or more components with at least one timing critical connection prior to performing a detailed routing of the circuit design.

2. The method of claim 1, further comprising, between said steps (b) and (c), determining timing critical connections and routing timing critical connections using a delay mode.

3. The method of claim 2, wherein said step (d) relocates only one or more components with at least one timing critical connection routed in the delay mode.

4. The method of claim 2, further comprising sorting connections into classes according to whether a connection was routed in the delay mode, a resource mode, or a combination of the delay and the resource modes.

5. The method of claim 4, wherein said steps (c) and (d) are limited to operating on at least one of said classes.

6. The method of claim 2, further comprising determining a weight for each circuit component according to timing delays of connections of each circuit component, wherein said step (d) selectively relocates components according to determined weights of components.

7. A system for physically designing a circuit comprising:
a global placer configured to determine initial locations of components in a circuit design;
a router configured to determine initial connections for placed components using an overlap mode and determine timing critical connections of the circuit design; and
a routing aware placer configured to relocate the components of the circuit design having at least one timing critical connection as determined by said router.

8. The system of claim 7, wherein said router further reroutes connections determined to be timing critical using a delay mode and reroutes connections of components relocated by said routing aware placer.

9. A computer automated system for physically designing a circuit comprising:
means for assigning initial locations to components in the circuit design;
means for determining an initial routing of connections between components in the circuit design using an overlap mode;
means for determining timing critical connections; and
means for selectively relocating components with at least one timing critical connection prior to performing a detailed routing of the circuit design.

10. The system of claim 9, further comprising means for causing said means for determining an initial routing, said means for determining timing critical connections, and said means for selectively relocating components, to continue to operate until a stopping criterion is met.

11. The system of claim 9, further comprising, means, operable between said means for determining an initial routing and said means for determining timing critical connections, for determining timing critical connections and routing timing critical connections using a delay mode.

12. The system of claim 11, wherein said means for selectively relocating components relocates only components with at least one timing critical connection routed in the delay mode.

13. The system of claim 11, further comprising means for sorting connections into classes according to whether the connection was routed in the delay mode, a resource mode, or a combination of the delay and the resource modes.

14. The system of claim 13, wherein said means for determining timing critical connections and said means for selectively relocating components are limited to operating on at least one of said classes.

15. The system of claim 11, further comprising means for determining a weight for each circuit component according to timing delays of connections of each circuit component, wherein said means for selectively relocating components relocates components according to the determined weights of components.

16. A machine readable storage, having stored thereon a computer program having a plurality of code sections executable by a machine for causing the machine to perform the steps of:
(a) assigning initial placements to components in the circuit design in a non-timing mode;
(b) determining an initial routing of connections between components in the circuit design using an overlap mode;
(c) determining timing critical connections; and
(d) selectively re-placing components with at least one timing critical connection prior to performing a detailed routing of the circuit design.

17. The machine readable storage of claim 16, further causing the machine to perform the step of repeating said steps (b) through (d) until a stopping criterion is met.

18. The machine readable storage of claim 16, further causing the machine to perform the steps of, between said steps (b) and (c), determining timing critical connections and routing timing critical connections using a delay mode.

19. The machine readable storage of claim 18, wherein said step (d) re-places only components with at least one timing critical connection routed in the delay mode.

20. The machine readable storage of claim 18, further causing the machine to perform the step of sorting connections into classes according to whether the connection was routed in the delay mode, a resource mode, or a combination of the delay and the resource modes.

21. The machine readable storage of claim 20, wherein said steps (c) and (d) are limited to operating on at least one of said classes.

22. The machine readable storage of claim 18, further causing the machine to perform the step of determining a weight for each circuit component according to timing delays of connections of each circuit component, wherein said step (d) selectively re-places components according to determined weights of components.

* * * * *